United States Patent [19]
Shindou et al.

[11] Patent Number: 5,850,921
[45] Date of Patent: Dec. 22, 1998

[54] CONTAINER FOR STORAGE DISK

[75] Inventors: Hirokazu Shindou; Yasuhiro Okamura, both of Kawagoe; Motoyuki Narisawa, Ichihara, all of Japan

[73] Assignee: Hymold Company, Limited, Isezaki, Japan

[21] Appl. No.: 927,492

[22] Filed: Sep. 11, 1997

[30]     Foreign Application Priority Data

Mar. 24, 1997  [JP]  Japan .................................. 9-088916

[51] Int. Cl.⁶ ............................................... B65D 85/48
[52] U.S. Cl. ........................ 206/711; 206/454; 206/445
[58] Field of Search ............................ 206/308.1, 445, 206/710–712, 454–456, 832; 211/41.12

[56]             References Cited

U.S. PATENT DOCUMENTS

| | | | |
|---|---|---|---|
| 4,253,571 | 3/1981 | Keohan | 206/445 |
| 4,520,925 | 6/1985 | Johnson | 206/711 |
| 4,817,799 | 4/1989 | Gregerson et al. | 206/454 |
| 5,228,568 | 7/1993 | Ogino et al. | 206/711 |
| 5,255,797 | 10/1993 | Kos | 206/711 |
| 5,273,159 | 12/1993 | Gregerson | 206/711 |
| 5,555,981 | 9/1996 | Gregerson | 206/711 |

*Primary Examiner*—Paul T. Sewell
*Assistant Examiner*—Luan K. Bui
*Attorney, Agent, or Firm*—Kanesaka & Takeuchi

[57]              ABSTRACT

To provide a container for storage disks which enables storage disks to be transported or stored without soiling, storage disks are arranged in a row in a disk holder. The disk holder is sealed inside upper and lower cases and circular apertures formed of semicircular cut-away portions at each of the two ends of the upper and lower cases are sealed by caps.

10 Claims, 9 Drawing Sheets

CONTAINER FOR STORAGE DISK

BACKGROUND OF THE INVENTION

1. Field of the Invention

This invention relates to a container for storage disk, and more particularly to a container for storage disks which stores a plurality of storage disks in a row at a predetermined interval apart such that their axes coincide with one another.

2. Description of Related Art

A container for storage disks, e.g. of the type described in for example U.S. Pat. No. 4,557,382 is used to transport or store storage disks, e.g. hard disks, in the process of their manufacture.

Circular storage disks are stored in rows at a predetermined interval apart inside a disk box. This disk box has an upper aperture which is sealed by an upper cover, and a lower aperture which is sealed by a lower cover. The disk box further comprises U-shaped cut-away portions so that the storage disks may be removed from the disk box. Two tongues are formed in a one-piece construction with the upper cover, the box being sealed when these tongues engage with the U-shaped cut-away portions.

In this conventional type of storage disk box, the engaging portion of the tongue formed in a one-piece construction with the upper cover comes in direct contact with the engaging edge of the disk box. Accordingly when the engaging portion is disengaged and the upper cover is removed, fine particles due to friction of the disengagement motion may enter through the cut-away portion of the disk box thereinto. These may adhere to and soil the storage disks contained in the disk box.

Further when the upper cover is attached so as to fit it over the upper aperture of the disk box, the upper cover is pressed down firmly. A flange which presses against the disks then rubs against the disks which may wear down the flange or crack it, producing fine particles which may adhere to the disks. This again leads to soiling of the disks. Moreover as a result of this damage to the flange, the number of times the upper cover can be used decreases, and it frequently has to be replaced by a new upper cover.

The contact surface area between guide teeth or the flange both formed on the inside of the upper cover and the disks is large, and as there are also many sliding parts, these come in contact with the circumferential edge of the disks. The resulting damage may also generate particles which soil the disks. To protect the storage disk package during transport and prevent the damages, it is covered with an external film for accomplishing a vacuum pack. However with this kind of packaging, when the film is opened, surrounding particles may adhere to the disk box, and these particles may enter the interior from the cut-away portion in the disk box when the upper cover is removed so that the disk coating is soiled.

Other disadvantages inherent in this conventional storage disk package were that the upper and lower covers merely sealed the upper and lower apertures in the disk box. The outer circumference of the disk box was exposed so that the disk box itself was easily scratched. This reduced the number of times that the disk box could be used, and due to the damages of the disk box, the storage disks inside were also soiled.

OBJECTS AND SUMMARY OF THE INVENTION

It is an object of this invention to solve the above problems brought by the conventional disk package.

Another object of this invention is to provide a container for storage disk wherein the storage disks contained therein do not easily become soiled, and which can be used repeatedly.

A further object of this invention is to provide a container for storage disk, wherein a disk holder containing the storage disks is sealed inside an outer case, and dust is more effectively prevented from entering the holder.

A still further object of this invention is to provide a container for storage disk, wherein a disk holder for holding the storage disk is enclosed within the outer case under a gastight seal.

A still further object of this invention is to provide a container for storage disk, wherein the container provides a better seal, and as a join of an upper case and a lower case is substantially parallel to a diameter of the storage disks, the storage disks are easily accessed from outside.

A still further object of this invention is to provide a container for storage disk, wherein cut-away portions are provided in the disk holder on an extention of the center axis of the storage disks, substantially semicircular cut-away portions are provided on extensions of the center axis of the storage disks in the upper and lower cases, and a substantially circular cap is provided to cover circular apertures formed by the semicircular cut-away portions in the upper and lower cases.

A still further object of this invention is to provide a container for storage disk, wherein as the circular aperture fromed by the semicircular cut-away portions in the upper and lower cases is sealed by the circular cap, there is no loss of access to the storage disks, while resistance to entry of dust is enhanced.

A still further object of this invention is to provide a container for storage disk, wherein the outer case housing the disk holder comprises a upper and lower cases and they are locked by locking member which engages with a step formed on an outer surface of the outer case.

A still further object of this invention is to provide a container for storage disk, wherein the storage disks are pressed by an pressure plate which is freely attached to and detached from the disks.

A still further object of this invention is to provide a container for storage disk, wherein the pressure plate capable of elastic deformation is fitted to the inside of the upper case such that it may be detached from the case, and the outer circumference of the storage disks are elastically held in place by the pressure plate.

A still further object of this invention is to provide a container for storage disk, wherein by keeping the pressure on the storage disks in a disk holder to a minimum portion, there is no soiling of the storage disks, and the disks can be maintained in a stable state inside the case.

According to one aspect of the invention, there is provided a container for storage disk comprising a disk holder for holding a plurality of storage disks arranged in a row at a predetermined interval apart so that their axes substantially coincide with each other, and an outer case for housing the disk holder, wherein the outer case houses the disk holder so as to form an effectively gastight seal.

The outer case may comprise an upper case and a lower case, and the upper case and the lower case may be fitted closely with each other at the parting surfaces by stepped engagement to form gastight seal, the parting surfaces extending substantially horizontally.

Further, cut-away portions may be formed in the disk holder on an extension of the center axis of the storage disks, substantially semicircular cut-away portions may be formed in respectively the upper case and lower case on an extension of the center axis of the storage disks, and substantially circular caps may be fitted so as to close circular apertures formed by the semicircular cut-away portions in the upper case and lower case.

Further, a pressure plate capable of elastic deformation may be fitted to the inside of the upper case so that it may be detachably attached to same, the outer circumference of the storage disks being elastically pressed by the pressure plate.

The storage disks in this invention may be circular plates used as recording media in computers or the like, which may be not only finished products but also semi-finished products in an intermediate stage of the manufacturing process.

The above and other objects, features and advantages of the invention will be apparent from the following description of illustrative embodiments, which are to be read in connection with accompaying drawings.

DETAILED DESCRIPTION OF THE PREFERRED EMBODIMENTS

Figure 1:
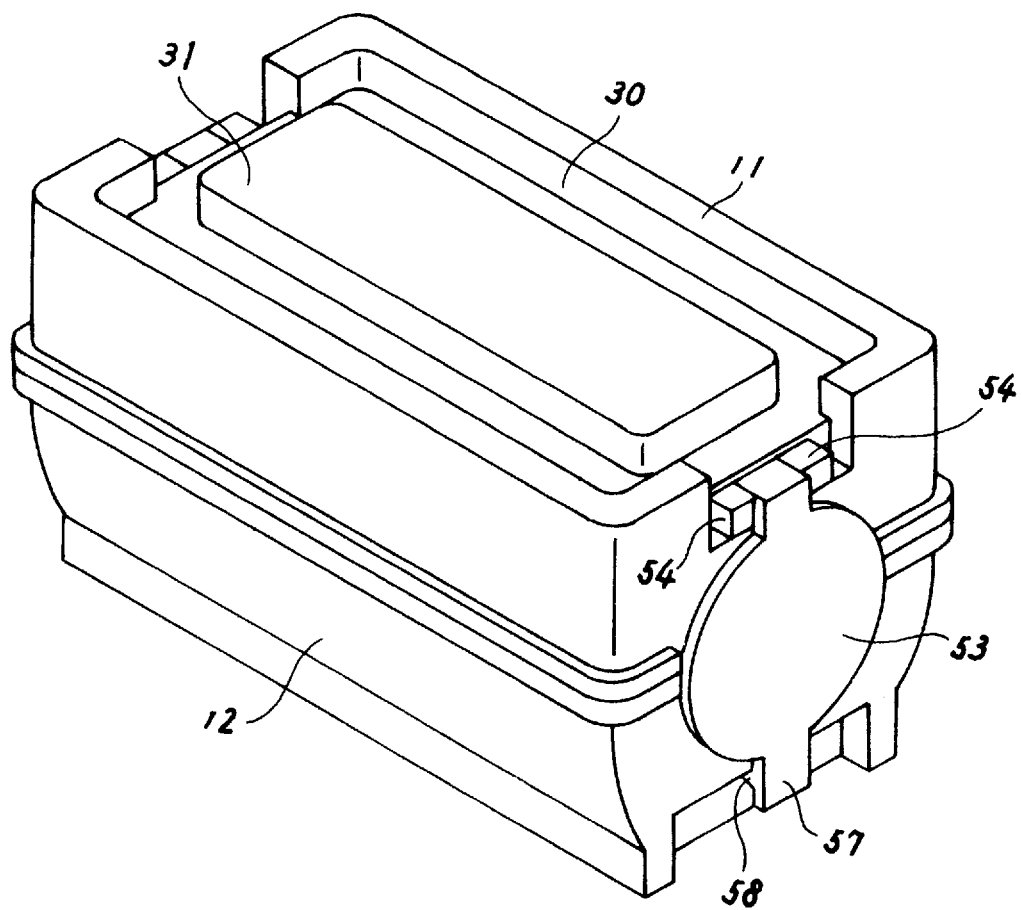
FIG. 1 is a perspective view of a container for storage disk or disks.
Figure 2:
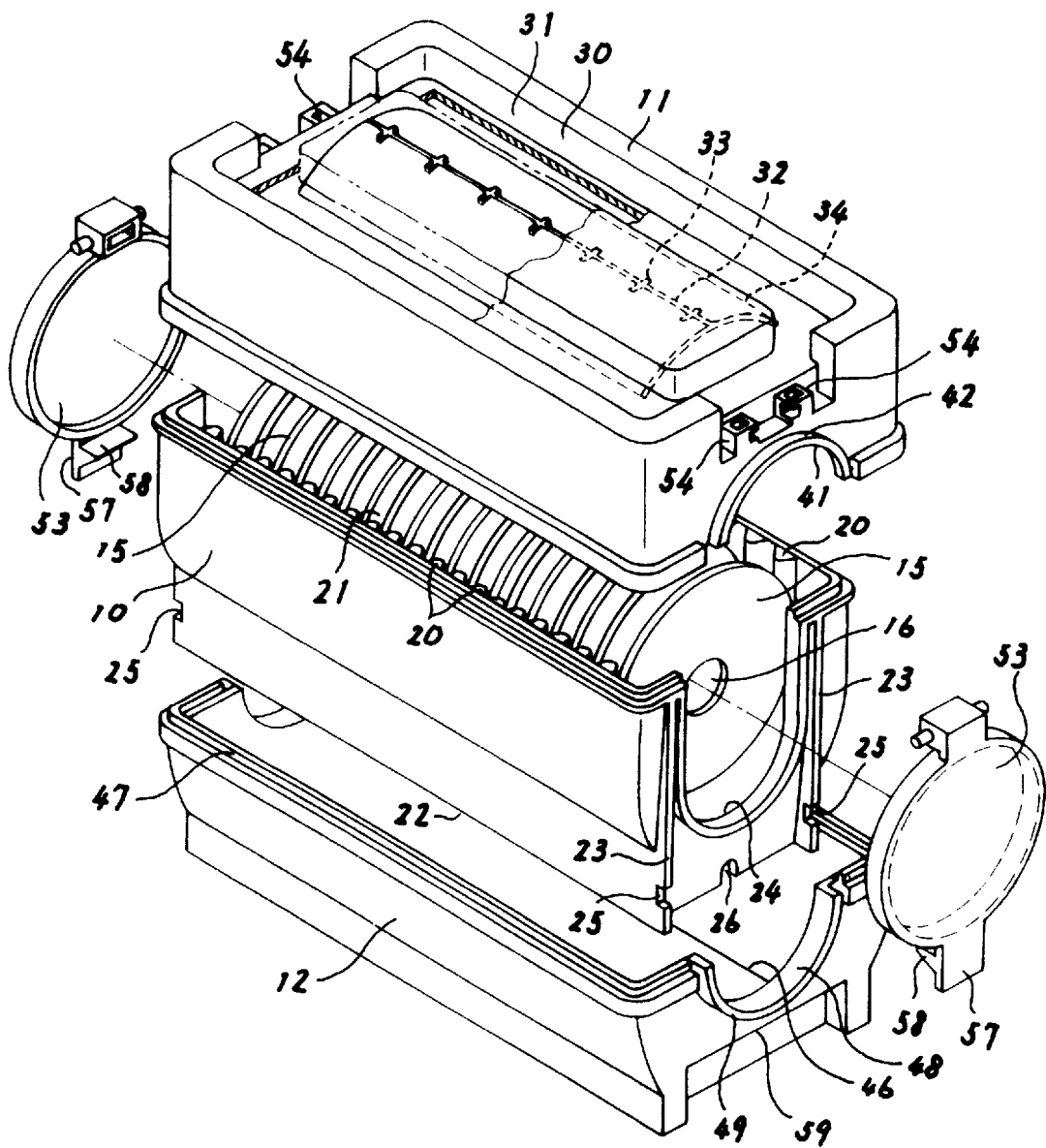
FIG. 2 is an exploded perspective view of a storage disk case.

Referring to FIG. 1 and FIG. 2 of the drawings, a container for storage disk according to one embodiment of this invention comprises a disk holder 10 and an outer case housing this disk holder 10 so that the assembly is gastight. The outer case is assembled from an upper case 11 and lower case 12. In the disk holder 10, for example, a predetermined number of hard disks 15 are arranged in a row at a predetermined interval apart such that their axes effectively coincide, as shown in FIG. 2. The hard disks 15 have center holes 16 in their middle.

The disk holder 10 is extrusion molded from a polycarbonate resin containing carbon powder in admixture, whereas the upper and lower cases 11, 12 are both polypropylene resin molded structures.

Next, the disk holder 10 is a substantially rectangular case having its longer dimension aligned in the axial direction of the hard disks 15 contained therein, and guide ribs 20 are sequentially formed in a one-piece construction on the insides of the mutually facing inside walls along the long sides. The hard disks 15 are arranged in a row at a predetermined interval apart in the axial direction by these guide ribs 20. The disk holder 10 has an upper aperture 21 and a lower aperture 22 (FIG. 9).

A pair of left and right liner projections 23 extending in an up/down direction and substantially parallel to one another is formed on outer surfaces of side walls on the shorter sides of the disk box 10. U-shaped cut-away portions 24 oriented downwards are formed in both side walls on the shorter sides of the disk box 10 between these liner projections 23. These U-shaped cut-away portions 24 are for the purpose of inserting a robot hand or the like for extracting the hard disks 15 inside the disk holder 10. A notch 25 is formed in a predetermined area of the lower part of each projection 23, and a notch 26 is formed effectively in the center at the lower extremity of this side wall.

Figure 3:
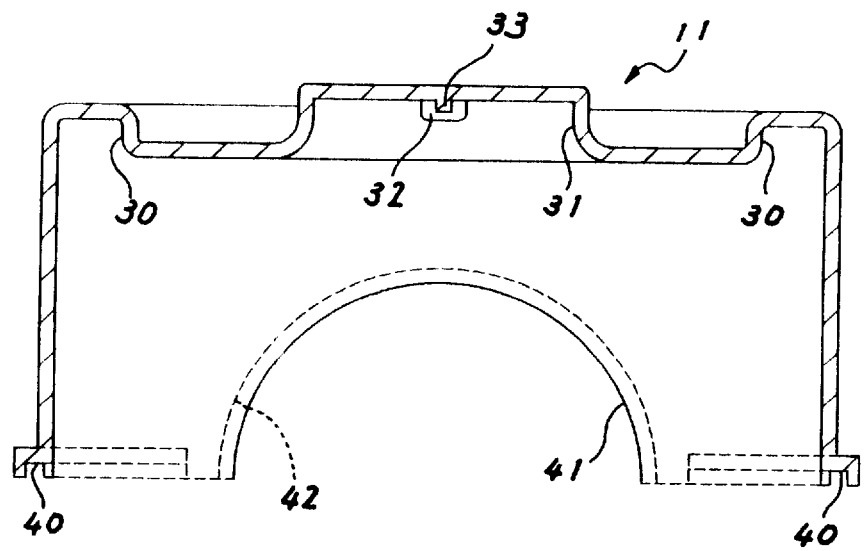
FIG. 3 is a vertical sectional view of an upper case.
Figure 4:
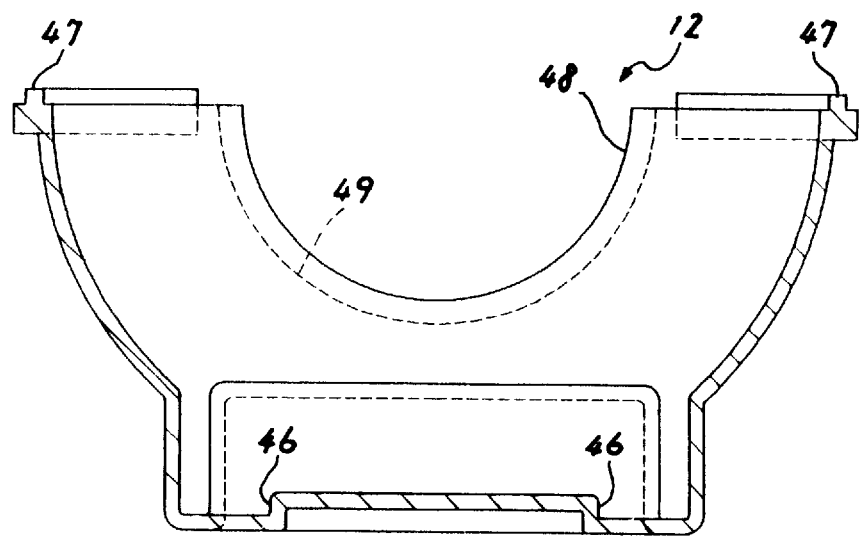
FIG. 4 is a vertical sectional view of a lower case.
Figure 5:
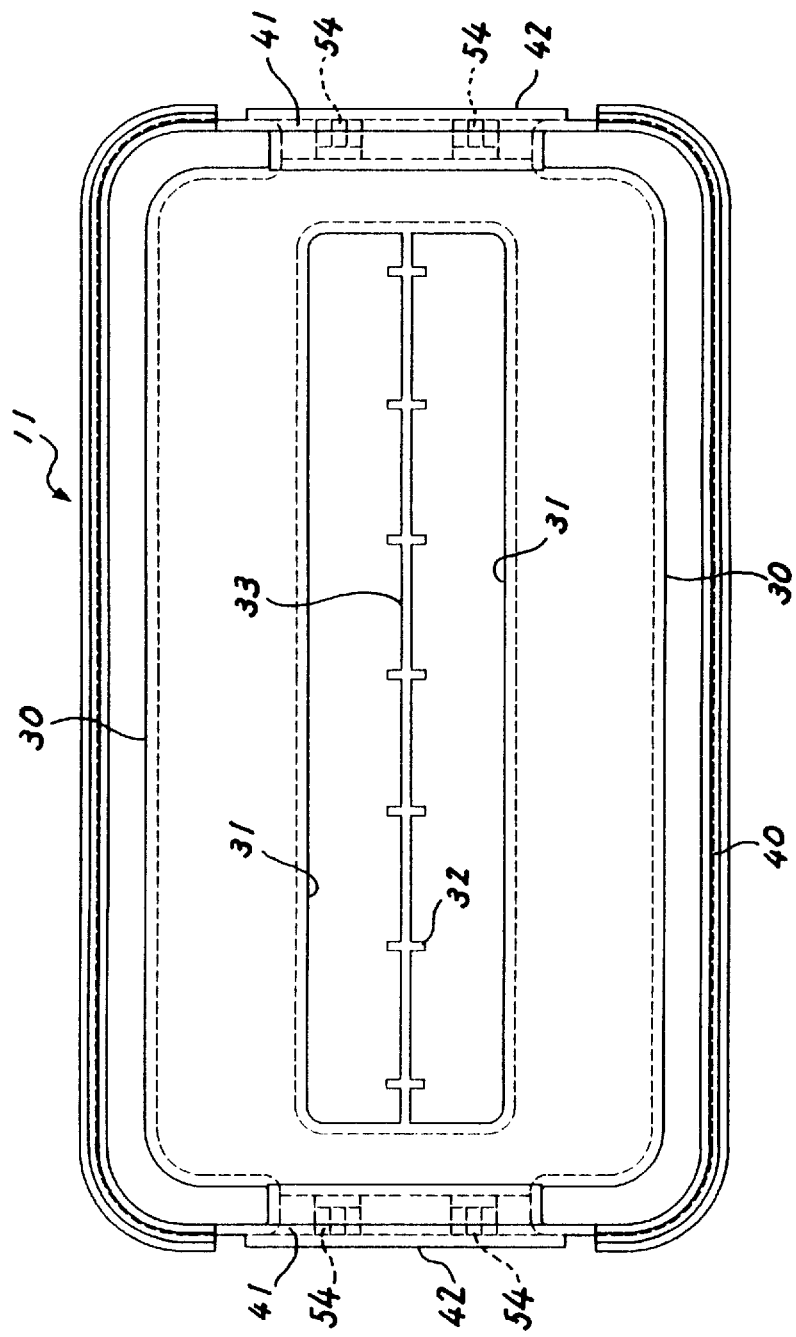
FIG. 5 is a bottom view of the the upper case.

Next, the outer case which houses this disk holder 10 in a gastight state will be described. The upper part of the outer case comprises the upper case 11. A step 30 is formed on a perimeter of a top plate of the upper case 11, as shown in FIG. 3 and FIG. 5. Due to this step 30, the middle part of the top plate projects downwards into the upper aperture 21 of the disk holder 10 as shown in FIG. 9. A recess 31 is also formed in the middle part close to the center of the top plate of the upper case 11. Ribs 32 are arranged at a predetermined interval in the axial direction of the hard disks 15 substantially in the center of this recess 31, as shown in FIG. 3 and FIG. 5. The ribs 32 are joined together by a projection 33.

Figure 8:
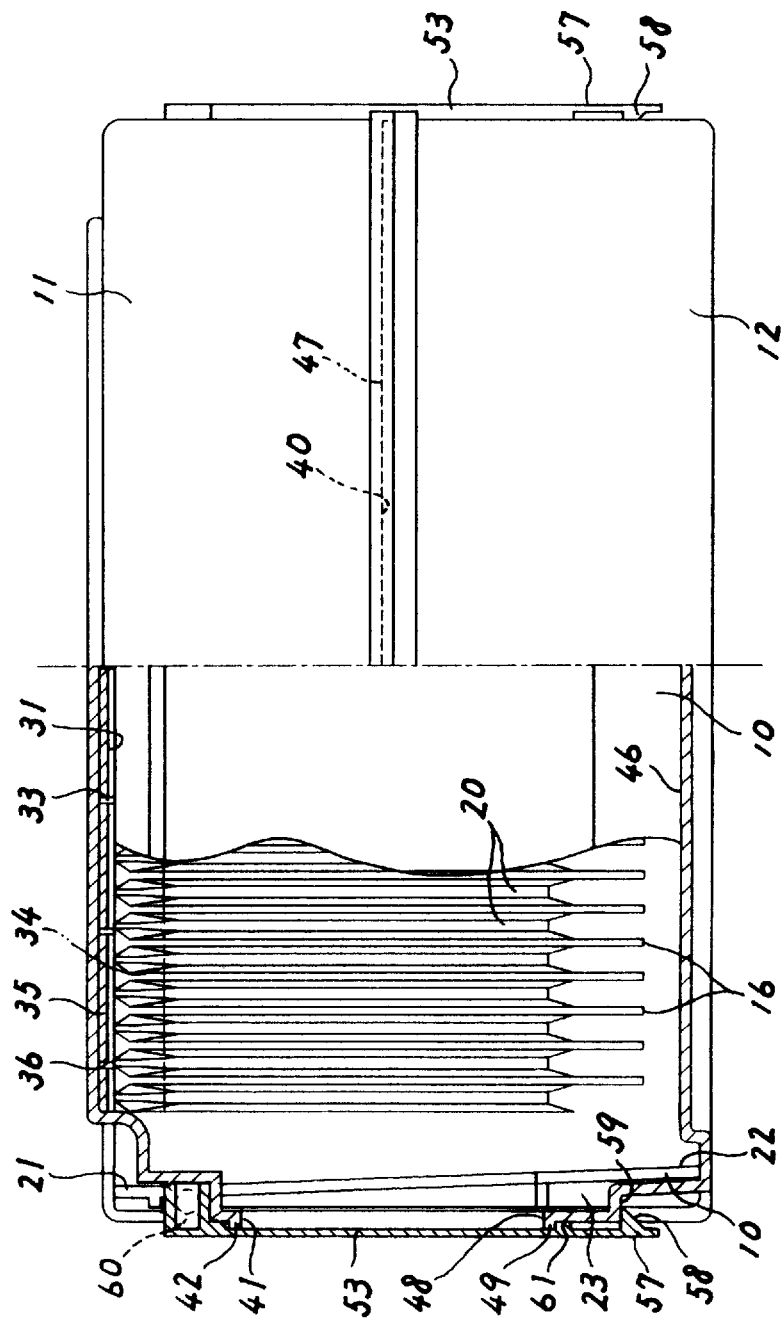
FIG. 8 is a partial cut-away side view of the container for storage disk containing hard disks.
Figure 9:
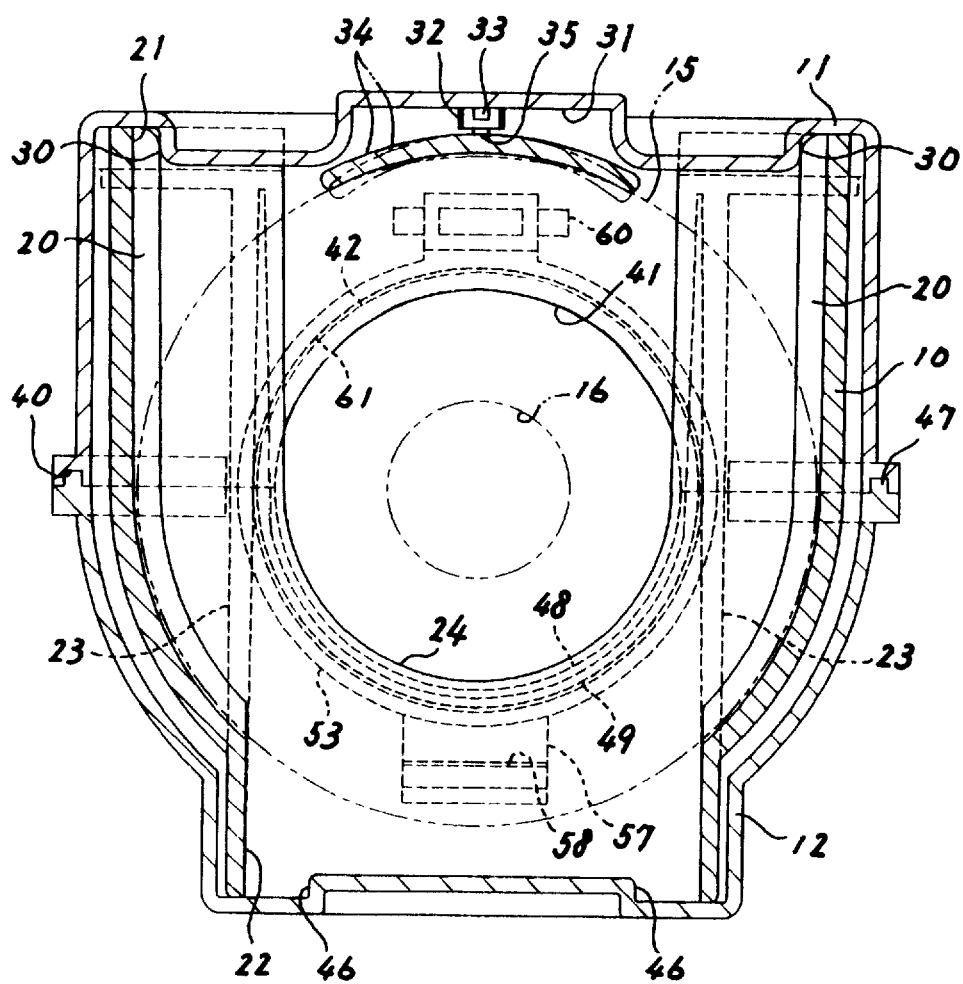
FIG. 9 is a vertical sectional view of the container for storage disk containing hard disks.

A pressure plate 34 shown in FIG. 2 and FIG. 9 is held underneath the upper case 11 in the recess 31 by these ribs 32 and projection 33. The pressure plate 34 is formed of a polycarbonate resin, and its top surface comprises projecting linear projection 35 as shown in FIG. 8 and FIG. 9. Notches 36 which are intermittently formed between the projection 35 engage with the ribs 32. The pressure plate 34 thereby fits inside the recess 31 in the upper case 11 so that it can be detached from same (FIG. 9).

A linear groove 40 is formed on the lower edge of an abuting surface of the upper case 11 in a thick part on its perimeter, as shown in FIG. 3 and FIG. 5. Semicircular cut-away portions 41 are respectively formed in the two end walls of the upper case 11 outside the U-shaped cut-away portions 24 of the disk holder 10 and effectively corresponding to the center axis of the hard disks 15. Ribs 42 are formed on the perimeters of the semicircular cut-away portions 41.

In the lower case 12 forming the lower part of the outer case, on the other hand, a step 46 is formed on the perimeter of a base. This step 46 projects into the lower aperture 22 of the disk holder 10 (FIG. 9).

A ridge 47 is formed on an abuting top surface in a thick part on the perimeter of the upper edge of the lower case 12. This ridge 47 engages with a groove 40 in the upper case 11, and closely fits together with it so as to form an effectively gastight seal. Semicircular cut-away portions 48 are also formed in the lower case 12 at positions effectively corresponding to the center axis of the hard disks 15. Ribs 49 are formed on the perimeters of these semicircular cut-away portions 48.

When the upper and lower cases 11, 12 are fitted together as shown in FIG. 1, FIG. 8 and FIG. 9, the semicircular cut-away portions 41 in the upper case 11 and the semicircular cut-away portions 48 in the lower case 12 form circular apertures at both ends. To close these circular apertures, substantially circular caps 53 are respectively fitted to both ends of the upper case 11. The caps 53 are polypropylene resin molded structures.

Figure 6:
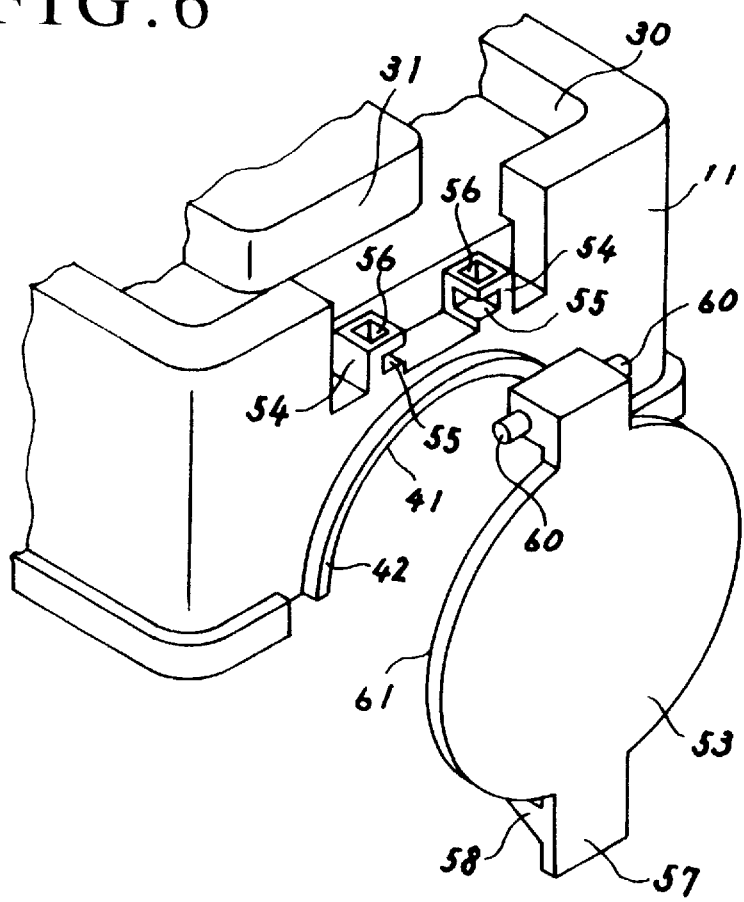
FIG. 6 is a perspective view of essential components showing a cap attachment.
Figure 7:
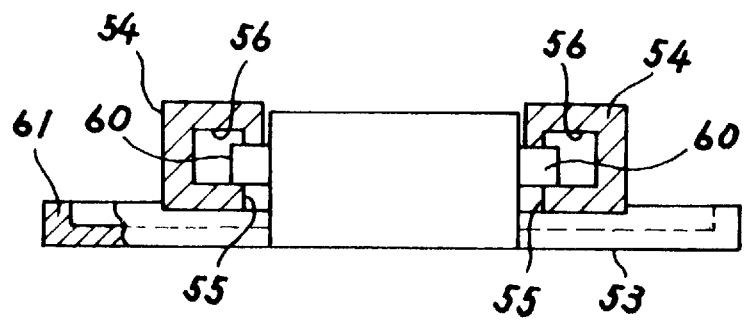
FIG. 7 is a horizontal sectional view of bearings showing the cap attachment.

Describing now the attachment of the caps 53, bearings 54 are integrally formed in the steps in the end walls of the side edges of the upper case 11 in which the semicircular cut-away portions 41 are formed, as shown in FIG. 6. Horizontal grooves 55 for receiving pins 60 of the cap 53 are formed in these bearings 54, and vertical holes 56 are also formed in the bearings 54. When the pins 60 are inserted in the bearings 54 through the groove 55, the pins 60 are pressed against the edges of the vertical holes 56 as shown in FIG. 7, and the cap 53 is thereby attached to the upper case 11 such that it is free to rotate.

A projecting member 57 is formed in a one-piece construction with the cap 53 such that it projects downwards, and a claw 58 is formed on the inside of this member 57. This claw 58 engages with a step 59 beneath the semicircular cut-away portion 48 in the lower case 12. The circular aperture formed by the semicircular cut-away portions 41, 48 is therefore sealed when closed by the cap 53 as shown in FIG. 8. Ribs 61 are formed on the inner circumference of the cap 53. These ribs 61 engage respectively with the rib 42 of the upper case 11 and the rib 49 of the lower case 12 so that, together with the semicircular cut-away portions 41, 48 at both ends, the structure is rendered gastight.

The container for storage disk according to this embodiment is used for example for storing hard disks 15 which are arranged in a row at a predetermined interval in an orderly fashion by the guide ribs 20 in the disk holder 10. The disk holder 10 containing the hard disks 15 is then placed in the outer case comprising the upper and lower cases 11 and 12.

First, the disk holder 10 containing the hard disks 15 is placed in the lower case 12. The upper case 11 is gently lowered over the lower case 12, and the two are joined together to form a seal due to the tight engaging of the grooves 40 of the upper case 11 with the ridges 47 of the lower case 12. The circular apertures formed by the semicircular cut-away portions 41, 48 at the two ends of the upper and lower cases 11, 12, are then sealed by the cap 53. This action is accomplished by rotating the caps 53 around the bearings 54 by the pins 60 so that the claw 58 of the projecting member 57 of the cap 53 engages with the step 59 of the lower case 12. FIG. 1 shows the disk holder 10 sealed inside the outer case comprising the upper and lower cases 11, 12.

The upper case 11 of the container for storage disk according to this embodiment comprises the grooves 40 on the lower edge of its four side walls, these grooves 40 engaging tightly with the ridges 47 on the upper edge of the four side walls of the lower case 12. The pressure plate 34 is installed in the upper case 11. The pressure plate 34 has an arc shape as shown in FIG. 9, and is thinner in its middle than at the two ends so as to give it a spring effect. When the pressure plate 34 is not in contact with the hard disks 15, the plate has a small curvature radius as shown by the dotted line in FIG. 9, but when in contact with the hard disks 15, the plate 34 deforms so that its curvature radius increases and the hard disks 15 are held in place by its resilience. This pressure plate 34 may moreover be freely attached and detached.

The semicircular cut-away portions 41, 48 are formed in the side walls on the short sides at the two ends of the upper and lower cases 11, 12, and the ribs 42, 49 are respectively formed in the perimeters of the cut-away portions 41,48. These cut-away portions 41, 48 are sealed by the caps 53. The caps 53 are circular, and the ribs 61 are formed on their outer perimeters. After the upper and lower cases 11, 12 are tightly fitted together, the ribs 42, 49 of the cut-away portions 41, 48 of the upper and lower cases 11, 12 engage with and are respectively enclosed by the ribs 61 of the caps 53 so as to form a gastight structure.

When the hard disks 15 are transported or stored in this package, the disk holder 10 in which the disks 15 are arranged is placed in the lower case 12, and the upper case 11 in which the caps 53 are free to rotate due to the bearings 54 is lowered over the lower case 12 so as to enclose the disk holder 10. The entire disk holder 10 containing the hard disks 15 is thereby protected by the engagement of the upper and lower cases 11, 12 due to the groove 40 and ridge 47.

In this container for storage disk, the disk holder 10 containing the hard disks 15 is enclosed within the outer case comprising the upper and lower cases 11, 12. A gastight seal is thereby maintained, and dust is more effectively prevented from entering the container.

The upper and lower cases 11, 12 are locked by the claws 58 on the projecting members 57 of the caps 53 attached to the upper case 11 via the bearings 54. In this locking process, the claw 58 of the cap 53 engages with the step 59 at the lower extremity of the semicircular cut-away portion 48 of the lower case 12, and the disk holder 10 is unaffected by the locking of the upper and lower cases 11, 12. Any particles due to friction between the claw 58 and step 59 are therefore produced externally to the outer case, so the hard disks 15 inside the disk holder 10 are not soiled.

The pressure plate 34, which is provided such that it may be freely attached to or detached from the upper case 11, presses the hard disks 15 in the disk holder 10 from above. This causes the pressure plate 34 to elastically deform so that the hard disks 15 are held in place by a spring effect. By pressing the hard disks 15 on minimum portions, contact surface area between the hard disks 15 and pressure plate 34 is reduced. This prevents wearing and cracking of the pressure plate 34, and largely suppresses the production of particles by the pressure plate 34.

As described hereabove, the pressure plate 34 may be freely attached to or detached from the upper case 11. Therefore, when the pressure plate 34 is damaged, it is necessary to replace only the pressure plate 34 by a new plate, whereas the upper case 11 may on the other hand be used repeatedly.

After the disk holder 10 containing the hard disks 15 is sealed inside the upper and lower cases 11, 12, the entire assembly is vacuum packaged. When the film of this vacuum pack is broken, as the outer case comprising the upper and lower cases 11, 12 is effectively gastight, particles do not adhere to and are not aspirated into the outer case even when the interior of the outer case is at a negative pressure.

Since the disk holder 10 containing the hard disks 15 is rendered completely gastight by the outer case comprising the upper and lower cases 11, 12, soiling to the disk holder 10 itself is prevented, and the disk holder 10 may therefore be used repeatedly for a large number of times.

Figure 10:
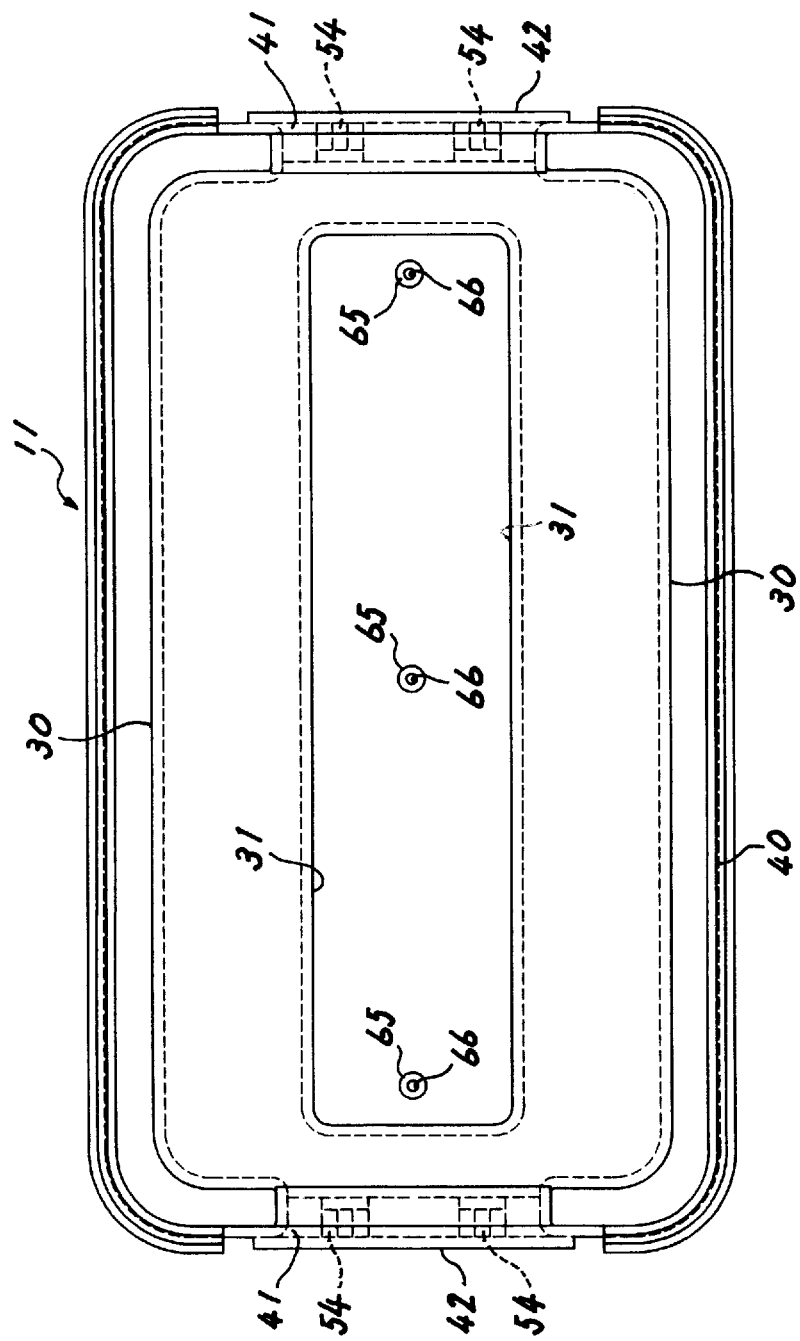
FIG. 10 is a bottom view of the upper case according to another embodiment.
Figure 11:
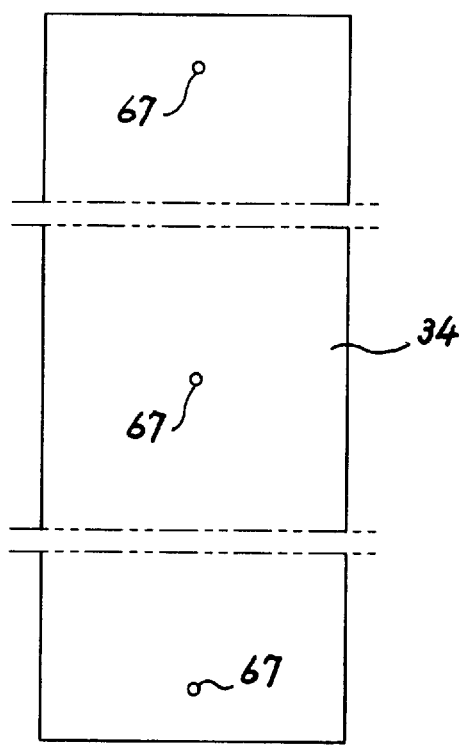
FIG. 11 is a plan view of a pressure plate.

Next, another embodiment will be described with reference to FIG. 10–FIG. 12. According to this embodiment, the attachment structure of the pressure plate 34 is different, three bosses 65 being implanted in the recess 31 on the underside of the upper case 11 as shown in FIG. 10. The bosses 65 are of tubular construction, and comprise fixing holes 66 in their centers. Three pins 67 are correspondingly formed on the upper surface of the pressure plate 34, as shown in FIG. 11. These pins 67 are pressed into the fixing holes 66 of the bosses 65 in the recess 31 of the aforesaid upper case 11.

Figure 12:
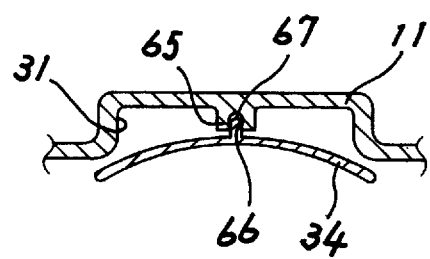
FIG. 12 is a vertical sectional view of essential components showing the pressure plate attachment.

FIG. 12 shows the situation when the pins 67 are pressed into the fixing holes 66 in the bosses 65 in the recess 31 of the upper case 11 so as to attach the pressure plate 34 to the underside of the upper case 11. When this pressure plate 34 elastically presses on the outer circumferential surfaces of the hard disks 15, the hard disks 15 are maintained in a stable state inside the disk holder 10.

Having described specific embodiments of this invention with reference to the accompanying drawings, it is to be understood that the invention is not limited to those precise embodiments, and that various changes and modifications may be made by one slilled in the art without departing from the scope or the spirit of the invention as described in the appended claims.

What is claimed:

1. A container for storage disks comprising:

a disk holder for holding a plurality of storage disks arranged in a row at a predetermined interval so that axes of the storage disks substantially coincide with each other, said disk holder having cut-away portions located at end areas opposite to each other and intersecting the axes of the storage disks, an outer case for housing said disk holder and being formed of upper and lower cases, said upper and lower cases having cut-away portions near the end areas, respectively, said cut-away portions of the upper and lower cases located at each of the end areas facing each other to form one aperture when the upper and lower cases are joined, and caps attached to the outer case for closing the apertures formed by the cut-away portions of the upper and lower cases.

2. A container for storage disks as defined in claim 1, wherein said upper case and said lower case are fitted closely with each other at parting surfaces with stepped edges to form a gastight seal.

3. A container for storage disks as defined in claim 2, wherein one of said upper case and said lower case comprises a projecting memebers and the other of said upper case and said lower case comprises a groove, and said projecting member fits into said groove so as to form a gastight seal.

4. A container for storage disks as defined in claim 3, wherein said groove is formed on the parting surface of said upper case, and said projecting member comprises a ridge formed integrally on the parting surface of said lower case, said groove and said ridge engaging tightly with each other by stepped edge engagement.

5. A container for storage disks as defined in claim 1, wherein ribs are respectively formed on perimeters of said cut-away portions of said upper case and said lower case, and ribs are formed on outer perimeters of said caps for tightly fitting with said ribs of said upper case and said lower case when said caps close apertures formed by said cut-away portions in said upper case and said lower case.

6. A container for storage disks as defined in claim 1, wherein each of said caps is rotatably supported by said upper case through bearing means and has a projecting member with a claw which engages with a step at a lower extremity of the cut-away portion of said lower case for locking said upper and lower cases.

7. A container for storage disks as defined in claim 1, wherein a pressure plate capable of elastic deformation is detachably fitted to an inside of said upper case, the outer circumferences of said storage disks being elastically pressed by said pressure plate.

8. A container for storage disks as defined in claim 7, wherein said pressure plate comprises linear projections on its top surface and notches are intermitently formed between said projections for engaging with ribs formed on said upper case for detachably attaching to the upper case.

9. A container for storage disks as defiend in claim 7, wherein pins are formed on a top surface of said pressure plate, and tubular bosses with fixing holes are formed on said upper case, said fixing holes of said tubular bosses receiving said pins so as to attach said pressure plate to an underside of said upper case.

10. A container for storage disks as defined in claim 1, wherein said cut-away portions of the upper and lower cases are semicircular, and said caps are substantially circular, said outer case housing the disc holder sealingly.

* * * * *